United States Patent
Cheng et al.

(10) Patent No.: US 10,418,825 B2
(45) Date of Patent: Sep. 17, 2019

(54) VOLTAGE BALANCING CIRCUIT

(71) Applicant: THE HONG KONG POLYTECHNIC UNIVERSITY, Hong Kong (HK)

(72) Inventors: Ka Wai Eric Cheng, Hong Kong (HK); Yuanmao Ye, Hong Kong (HK); Xiangdang Xue, Hong Kong (HK)

(73) Assignee: THE HONG KONG POLYTECHNIC UNIVERSITY, Hong Kong (HK)

( * ) Notice: Subject to any disclaimer, the term of this patent is extended or adjusted under 35 U.S.C. 154(b) by 1 day.

(21) Appl. No.: 15/518,243

(22) PCT Filed: Jun. 2, 2015

(86) PCT No.: PCT/CN2015/080603
§ 371 (c)(1),
(2) Date: Apr. 10, 2017

(87) PCT Pub. No.: WO2016/054925
PCT Pub. Date: Apr. 14, 2016

(65) Prior Publication Data
US 2017/0310128 A1 Oct. 26, 2017

(30) Foreign Application Priority Data
Oct. 8, 2014 (CN) .......................... 2014 1 0526118

(51) Int. Cl.
*H02J 7/00* (2006.01)
*H03K 17/687* (2006.01)
*H02J 7/34* (2006.01)

(52) U.S. Cl.
CPC .............. *H02J 7/0019* (2013.01); *H02J 7/00* (2013.01); *H03K 17/687* (2013.01); *H02J 7/345* (2013.01)

(58) Field of Classification Search
CPC ....... H02J 7/0019; H02J 7/345; H03K 17/687
USPC ........................................................ 320/116
See application file for complete search history.

(56) References Cited

U.S. PATENT DOCUMENTS

| 5,710,504 A | 1/1998 | Pascual et al. | |
|---|---|---|---|
| 8,390,147 B2* | 3/2013 | Stauth | H02J 3/385 307/77 |
| 2006/0080802 A1* | 4/2006 | Tani | G05D 1/0225 15/319 |

FOREIGN PATENT DOCUMENTS

CN          103733466 A        4/2014

OTHER PUBLICATIONS

International Search Report of PCT Patent Application No. PCT/CN2015/080603 dated Aug. 21, 2015.

* cited by examiner

*Primary Examiner* — M Baye Diao

(57) ABSTRACT

A voltage balancing circuit is applied to a power supply system. The power supply system comprises N power storage devices. The voltage balancing circuit comprises: N switches, N capacitors and a controller; the N switches are respectively connected to the N serial power storage devices; the N switches are respectively connected to the first terminals of the N capacitors; the second terminals of the N capacitors are connected to a common neutral line; the controller is connected to the N switches through a control line to control the switching of the N switches. The voltage balancing circuit avoids power loss when balancing the voltage of a plurality of serial power storage devices, and is small in size and low-cost, and balances voltage quickly.

5 Claims, 7 Drawing Sheets

VOLTAGE BALANCING CIRCUIT

TECHNICAL FIELD

The present application relates to the technical field of voltage equalization of series power storage devices, and particularly relates to a voltage balancing circuit.

BACKGROUND OF THE INVENTION

Rechargeable power storage devices, such as lead-acid batteries, lithium-ion batteries and super capacitors, have been widely used in portable devices, industrial applications, hybrid and electric vehicles and other fields. For these power storage devices, the voltage is limited, such as the voltage of lithium-ion battery is about in the range of 3V~4.3V, and the voltage of the super capacitor is usually not more than 2.7V.

In order to meet the application requirements of high voltage applications in practical applications, the high storage voltage of these power storage devices is usually obtained by connecting a plurality of power storage devices in series. However, during the charging and discharging of the plurality of power storage devices in series, the voltage imbalance of the respective power storage devices may occur, taking the power storage device as the battery for an example, in the charging phase, each battery in series is like a voltage divider, because the different battery capacity and/or battery leakage, the battery voltage will be imbalanced. Specifically, a battery with a smaller electrical capacity will be subjected to greater voltage stress and the battery will be damaged if the voltage stress exceeds the maximum voltage that the battery can withstand. Therefore, for a plurality of power storage devices connected in series, the voltage equalization between the power storage units is very important.

In the prior art, the voltage equalization of each power storage unit is realized by discharging the power storage unit having a higher voltage to the resistance. However, this method has some drawbacks, that is, the power of high-voltage power storage device consumed in the discharge resistance causes additional power loss. At present, in order to overcome the technical drawbacks of the above-mentioned voltage equalization method which can cause power loss, a method of voltage equalization of non-dissipative active batteries is proposed in the prior art, such as by using a flyback power conversion technology or bidirectional buck-boost power conversion technology to achieve equalization of the voltage equalization circuit. Although, in these methods, it is not necessary to consume power in a discharge resistance; however, battery-balanced circuits based on flyback power converters or bidirectional buck-boost power converters contain bulky magnetic components that can result in larger and higher cost of balanced circuits.

Further, in order to reduce the circuit volume of the equalization system and to reduce the cost of consumption, in the related patents (such as U.S. Pat. No. 5,710,504), an automatic battery voltage equalization system based on switched capacitor technology is proposed. As shown in FIG. 1, a battery voltage equalization circuit based on the switching capacitor is provided by the patent, and is used to equalize the voltage of n battery cells (Cell1~Celln) in series. In the equalization circuit of FIG. 1, it comprises n single-pole double-throw switches (S1~Sn, n is an integer greater than or equal to 1), n−1 capacitors (C1~Cn−1) and a control unit; wherein, the two static terminals of any switch of the n single-pole double-throw switches are respectively connected to the positive electrode and the negative electrode of a corresponding battery unit; the selecting terminals of each two adjacent switches of the n single-pole double-throw switches are connected through a corresponding capacitor; the control unit is used to control the n single-pole double-throw switches to be switched off. As can be seen from FIG. 1, the bulky magnetic components are not provided in the battery voltage equalization circuit, reducing the circuit volume and cost consumption of the equalization system. However, this voltage equalization circuit provides only a charge transfer path between adjacent cell cells in a plurality of series cells. For the entire voltage equalization system circuit, the voltage equalization speed is limited. Then when the number of batteries in series is relatively large, through this voltage equalization circuit, it takes a lot of time to achieve the voltage balance between the battery cells. It can be seen that there is still a technical problem that the voltage equalization circuit based on the switched capacitor has a low voltage equalization speed and are not suitable to the voltage equalization of the large number of power storage unit series links.

Technical Problem

The present application provides a voltage balancing circuit to solve the technical problems that the voltage equalization method of the prior art power storage device has the power consumption, the balance circuit is large in size and the cost is high, and the voltage equalization speed is slow, and to realize the technical effect that when balancing the voltage of a plurality of series power storage devices, the power loss is not involved, the voltage balancing circuit is small and low-cost and balances voltage quickly, the circuit of the equalization circuit is small and the cost is low, and is suitable for the voltage equalization of the large number of power storage unit series links.

Solution to the Problem

Technical Solution

The present application provides a voltage balancing circuit applied to a power supply system, wherein, the power supply system comprises N power storage devices; any power storage device of the N power storage devices comprises a positive electrode and a negative electrode; the positive electrode of power storage device n of the N power storage devices is connected to the negative electrode of power storage device n+1 of the N power storage devices; where N is an integer greater than or equal to 2, and n is an integer greater than or equal to 1 and less than N; the voltage balancing circuit comprises:

N single-pole double-throw switches, single-pole double-throw switch i of the N single-pole double-throw switches comprises: a selecting terminal, a first static terminal and a second static terminal; the first static terminal of single-pole double-throw switch i is connected to the positive electrode of power storage device i of the N power storage devices; the second static terminal of single-pole double-throw switch i is connected to the negative electrode of power storage device i; where i is an integer greater than or equal to 1 and less than or equal to N;

N capacitors, capacitor i of the N capacitors comprises a first terminal and a second terminal; the first terminal of capacitor i is connected to the selecting terminal of single-pole double-throw switch i; the second terminal of capacitor i is connected to a common neutral line;

a switch controller connected to single-pole double-throw switch i through a control line; the switch controller is configured to control the selecting terminal of single-pole double-throw switch i to be connected to the first static terminal or the second static terminal of single-pole double-throw switch i.

Preferably, single-pole double-throw switch i comprises:
a first metal oxide semiconductor field effect transistor;
a second metal oxide semiconductor field effect transistor in series connection with the first metal oxide semiconductor field effect transistor.

Preferably, the selecting terminal of single-pole double-throw switch i is a connection point between the first metal oxide semiconductor field effect transistor and the second metal oxide semiconductor field effect transistor;
a grid of the first metal oxide semiconductor field effect transistor and a grid of the second metal oxide semiconductor field effect transistor are respectively connected to the switch controller through the control line.

Preferably, the voltage balancing circuit further comprises N inductors;
wherein, the second terminal of capacitor i is connected to the common neutral line through inductor i of the N inductors.

Preferably, the N power storage devices comprises at least one type of rechargeable batteries and super capacitors.

Preferably, the rechargeable battery is a single battery cell or a battery pack in which a plurality of single battery cells are connected in series, and the super capacitor is a single capacitor cell or a super capacitor pack in which a plurality of single super capacitor cells are connected in series.

Preferably, wherein, the switch controller sends a control signal to single-pole double-throw switch i through the control line to control the connection between the selecting terminal of single-pole double-throw switch i and the first static terminal or the second static terminal of single-pole double-throw switch i.

Preferably, the control signal is a bipolar square wave signal or a pair of complementary unipolar rectangular wave signals.

Preferably, the control signal controls single-pole double-throw switch i to be switched off at a fixed frequency or a variable frequency.

The Beneficial Effect of the Invention

Beneficial Effect

Since in the present application, the voltage balancing circuit comprises N single-pole double-throw switches, N capacitors and a switch controller; wherein, the N single-pole double-throw switches are respectively connected to the N serial power storage devices; and the N single-pole double-throw switches are respectively connected to N capacitors; specifically, the two static terminals of any of the N single-pole double-throw switches are respectively connected to the positive electrode and the negative electrode of the power storage device corresponding to the switch; the selecting terminal of the switch is connected to the first terminal of the capacitor corresponding to the switch; the second terminal of the capacitor is connected to a common neutral line; when the switch controller is connected to the switch through a control line, the switch controller can control the connection between the selecting terminal of the switch and the first static terminal or the second static terminal of the switch. Through this circuit design, when the voltage is balanced, the power consumption of the high voltage storage device is not needed to be discharged on the discharge resistance, and the heavy magnetic component is not needed; and between any two power storage devices of the N power storage devices, a path for the direct charge transfer between the two power storage devices is established, which solves the technical problems that the voltage equalization method of the prior art power storage device has the power consumption, the balance circuit is large in size and the cost is high, and the voltage equalization speed is slow, and realizes the technical effect that when balancing the voltage of a plurality of series power storage devices, the power loss is not involved, the voltage balancing circuit is small and low-cost and balances voltage quickly, and hence is suitable for the voltage equalization of the large number of power storage unit series links; the circuit of the equalization circuit is small and the cost is low.

BRIEF DESCRIPTION OF THE DRAWINGS

Description of Drawings

In order to more clearly illustrate the embodiments of the present application or the technical solutions in the prior art, the following drawings, which are intended to be used in the description of the embodiments or the prior art, will be briefly described. It will be apparent that the drawings in the following description Is an embodiment of the present invention, it will be apparent to those skilled in the art that other drawings may be obtained in accordance with the provided drawings without paying creative work.

Figure 1:
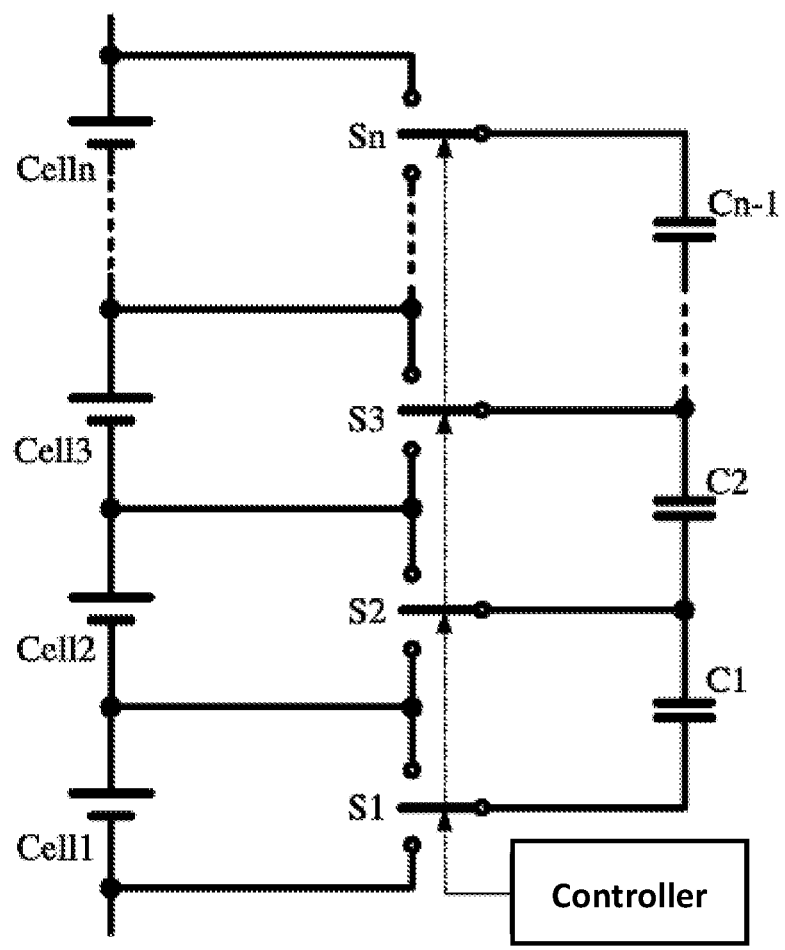
Figure 2:
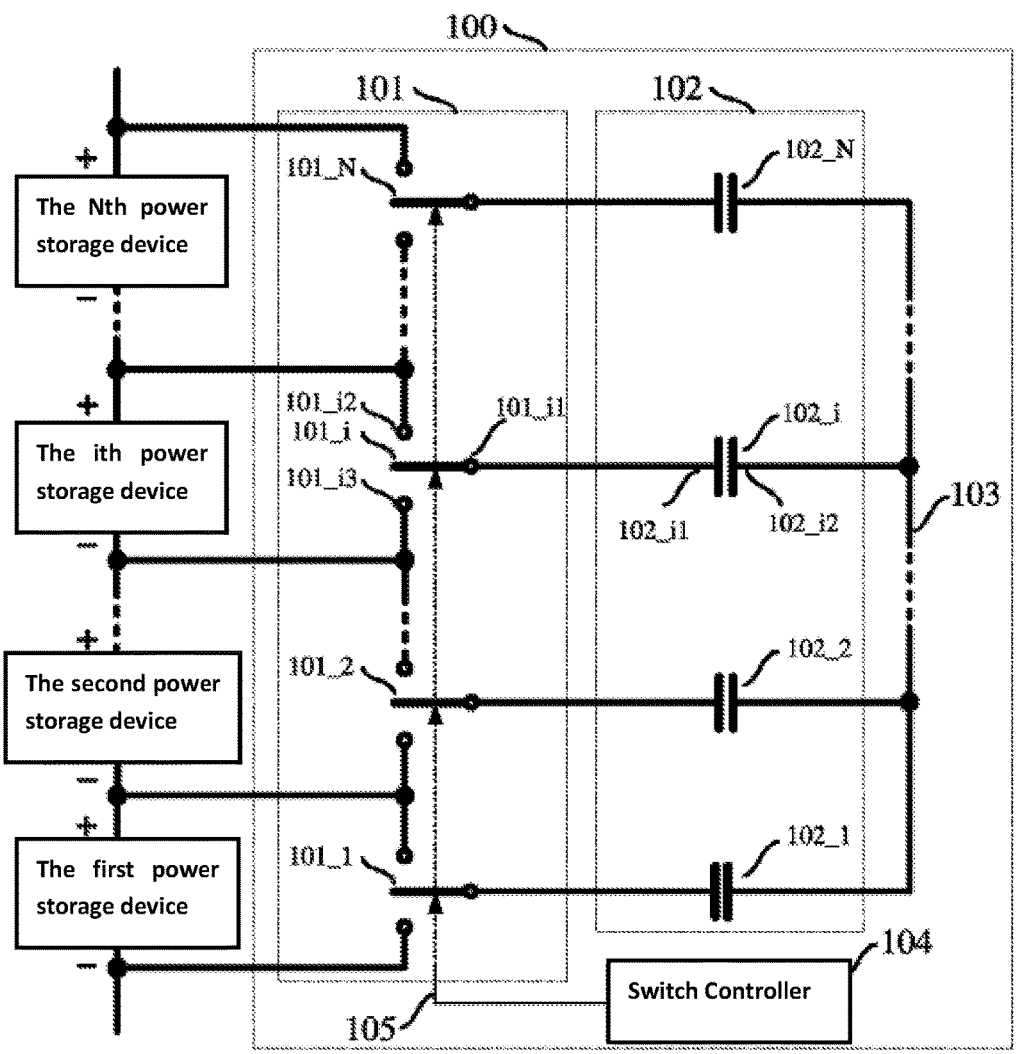
Figure 3A:
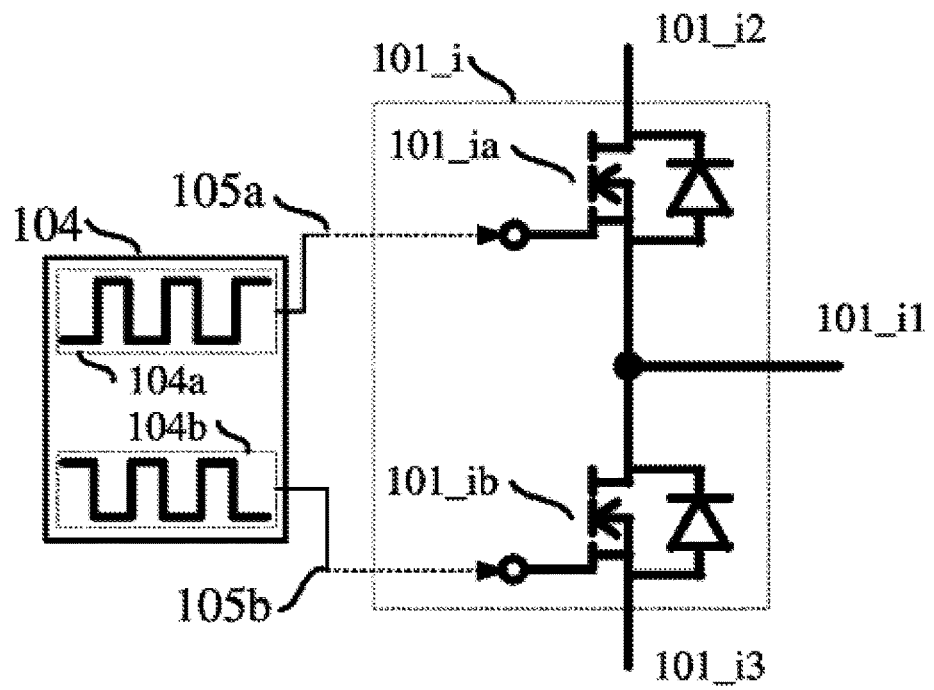
Figure 3B:
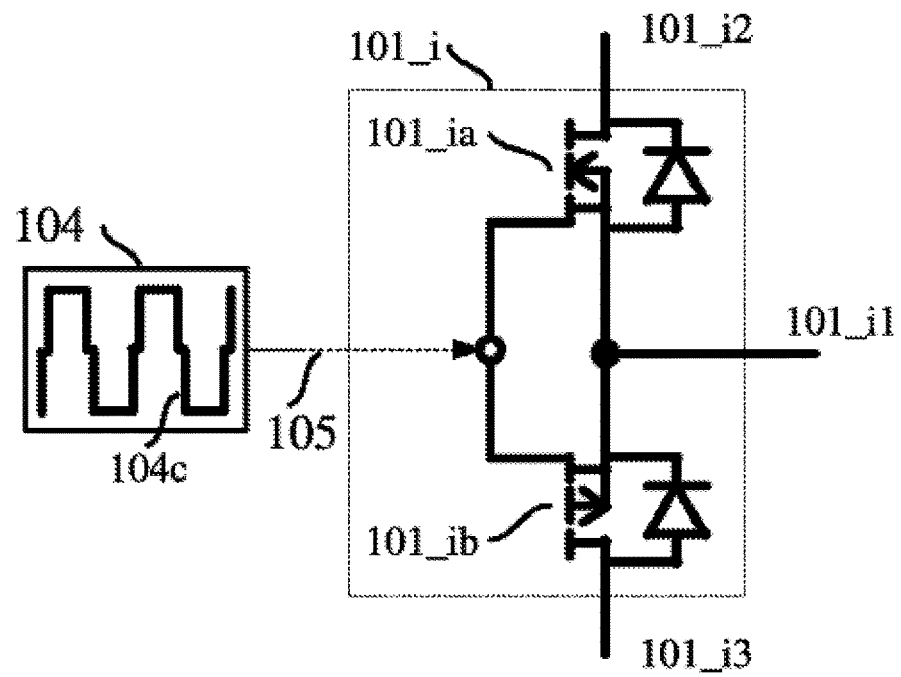
Figure 4A:
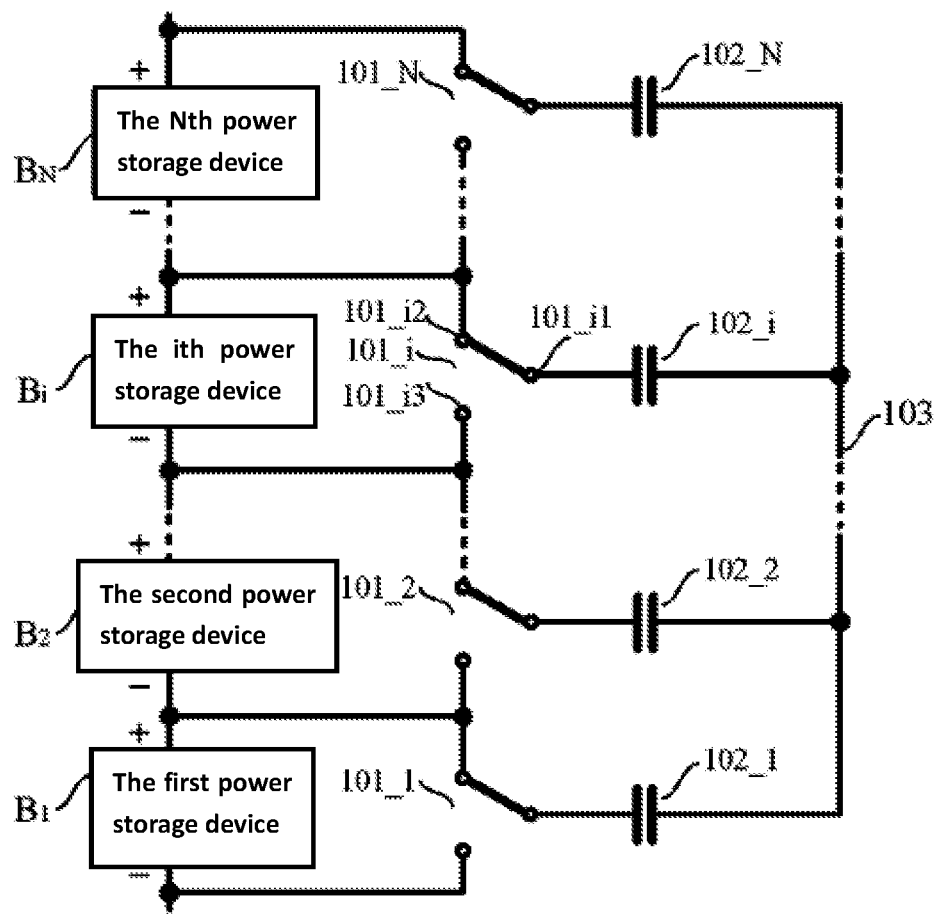
Figure 4B:
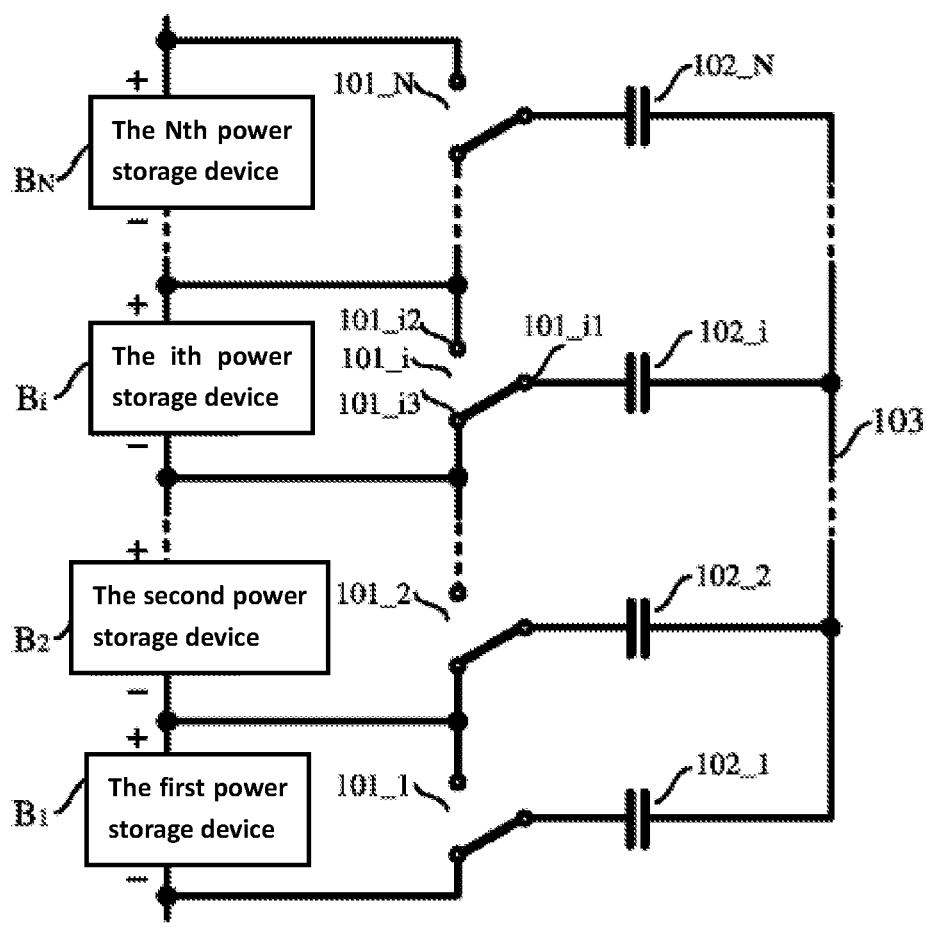
Figure 5:
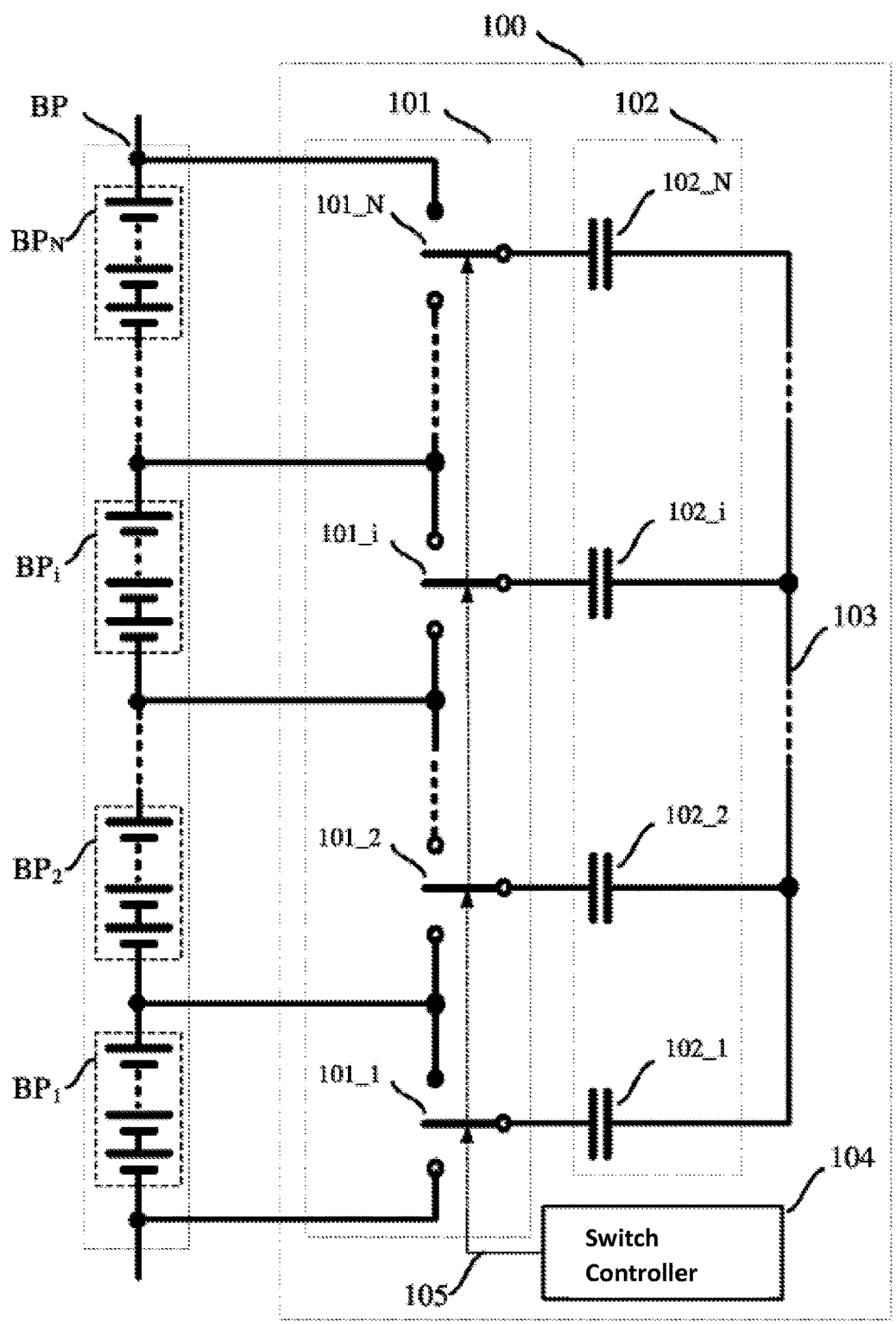
Figure 6:
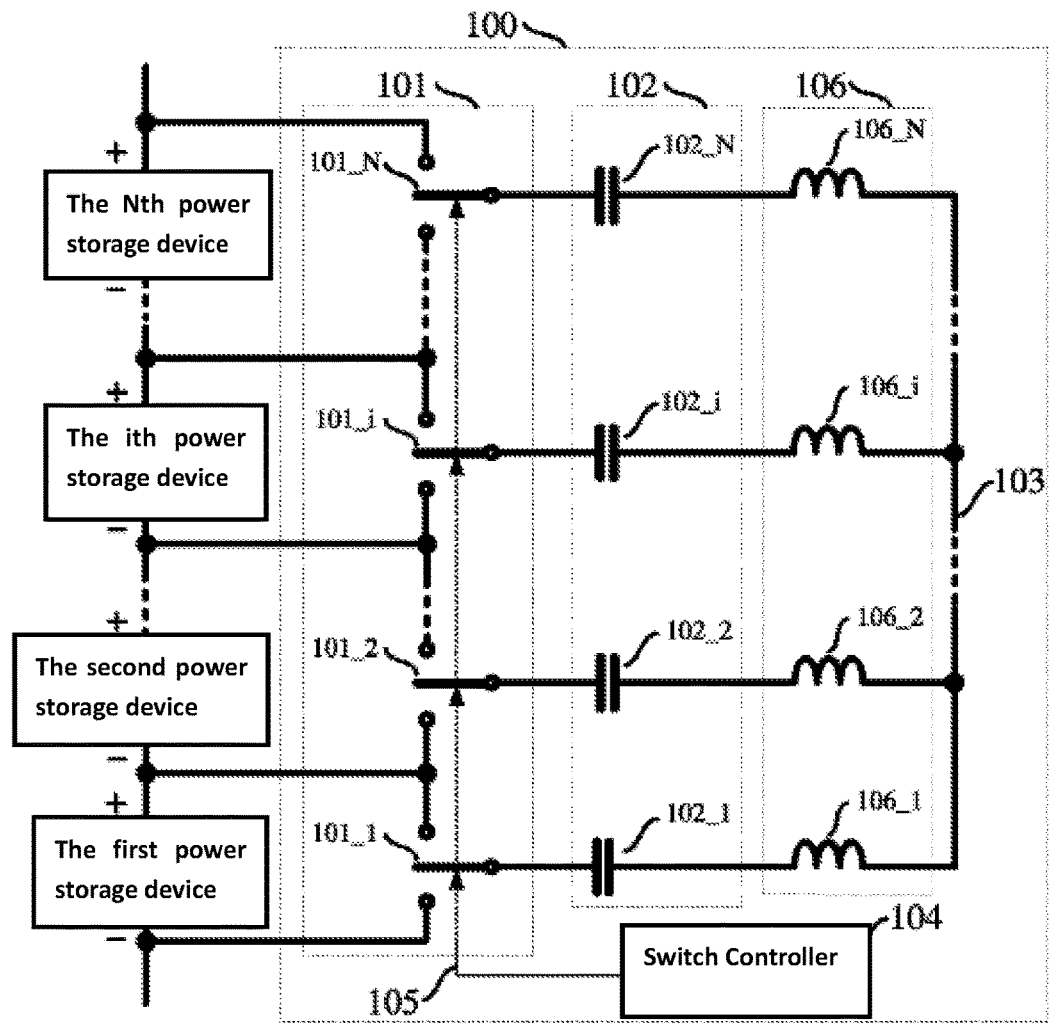

FIG. 1 provides a schematic diagram of a battery voltage balancing circuit based on a switching capacitor in the prior art;

FIG. 2 is a schematic diagram of a voltage balancing circuit, according to an embodiment of the present application;

FIGS. 3A-3B are schematic views showing the internal structure of any single-pole double-throw switch according to an embodiment of the present application;

FIGS. 4A-4B are schematic views of the two operating states of the voltage balancing circuit, according to an embodiment of the present application;

FIG. 5 is a circuit schematic diagram of voltage balancing for a plurality of series battery packs provided by an balancing circuit, according to an embodiment of the present application;

FIG. 6 is a schematic diagram of a low switching noise balancing circuit for an integrated inductor, according to an embodiment of the present application.

EMBODIMENT OF THE INVENTION

A voltage balancing circuit is provided by the present application, which solves the technical problems that the voltage equalization method of the prior art power storage device has the power consumption, the balance circuit is large in size and the cost is high, and the voltage equalization speed is slow, and realizes the technical advantageous effect that when balancing the voltage of a plurality of series power storage devices, the power loss is not involved, the voltage balancing circuit is small and low-cost, and balances voltage quickly, the balancing circuit is small and the cost is low, and is suitable for the voltage equalization of the large number of power storage unit series links.

In order to solve the above technical problems, the overall idea of the embodiment of the present application is as follows:

The embodiment of the present application provides a voltage balancing circuit applied to a power supply system, wherein, the power supply system comprises N power storage devices; any power storage device of the N power storage devices comprises a positive electrode and a negative electrode; the positive electrode of power storage device n of the N power storage devices is connected to the negative electrode of power storage device n+1 of the N power storage devices; where N is an integer greater than or equal to 2, and n is an integer greater than or equal to 1 and less than N; the voltage balancing circuit 100 comprises N single-pole double-throw switches, single-pole double-throw switch i of the N single-pole double-throw switches comprises: a selecting terminal, a first static terminal and a second static terminal; the first static terminal of single-pole double-throw switch i is connected to the positive electrode of power storage device i of the N power storage devices; the second static terminal of single-pole double-throw switch i is connected to the negative electrode of power storage device i; where i is an integer greater than or equal to 1 and less than or equal to N; N capacitors, capacitor i of the N capacitors comprises a first terminal and a second terminal; the first terminal of capacitor i is connected to the selecting terminal of single-pole double-throw switch i; the second terminal of capacitor i is connected to a common neutral line; a switch controller is connected to single-pole double-throw switch i through a control line; the switch controller is configured to control the selecting terminal of single-pole double-throw switch i to connect to the first static terminal or the second static terminal of single-pole double-throw switch i.

It can be seen that in the embodiment of the present application, by designing a voltage balancing circuit comprising N single-pole double-throw switches, N capacitors and a switch controller; wherein, the N single-pole double-throw switches are respectively connected to the N serial power storage devices; and the N single-pole double-throw switches are respectively connected to N capacitors; specifically, the two static terminals of any of the N single-pole double-throw switches are respectively connected to the positive electrode and the negative electrode of the power storage device corresponding to the switch; the selecting terminal of the switch is connected to the first terminal of the capacitor corresponding to the switch; the second terminal of the capacitor is connected to a common neutral line; when the switch controller is connected to the switch through a control line, the switch controller can control the connection between the selecting terminal of the switch and the first static terminal or the second static terminal of the switch. Through this circuit design, when the voltage is balanced, the power consumption of the high voltage storage device is not needed to be discharged on the discharge resistance, and the heavy magnetic component is not needed; and between any two power storage devices of the N power storage devices, a path for the direct charge transfer between the two power storage devices is established, which solves the technical difficulties that the voltage equalization method of the prior art power storage device has high power consumption, the balance circuit is large in size and the cost is high, and the voltage equalization speed is slow, and this invention realizes the technical advantageous effect that when balancing the voltage of a plurality of series power storage devices, the power loss is avoided, the voltage balancing circuit is small and low-cost and balances voltage quickly, the circuit of the balancing circuit is small and the cost is low, and is suitable for the voltage equalization of a large number of power storage unit series links.

In order to better understand the above-described technical solution, the above-described technical solution will be described in detail with reference to the accompanying drawings and specific embodiments, and it is to be understood that the specific features of the embodiments of the present application and the embodiments are detailed with respect to the technical solutions of the present application. The present application is not limited to the technical solution of the present application, and the technical features of the embodiments of the present application and the embodiments may be combined with each other without conflict.

Embodiment One

Referring to FIG. 2, the embodiment of the present application provides a voltage balancing circuit 100 applied to a power supply system. The power supply system comprises N power storage devices, such as N batteries; any power storage device of the N power storage devices comprises a positive electrode and a negative electrode; the positive electrode of power storage device n of the N power storage devices is connected to the negative electrode of power storage device n+1 of the N power storage devices; where N is an integer greater than or equal to 2, and n is an integer greater than or equal to 1 and less than N; the voltage balancing circuit 100 comprises:

N single-pole double-throw switches 101, single-pole double-throw switch i 101_*i* of the N single-pole double-throw switches 101 comprises: a selecting terminal 101_*i*1, a first static terminal 101_*i*2 and a second static terminal 101_*i*3; the first static terminal 101_*i*2 of single-pole double-throw switch i 101_*i* is connected to the positive electrode of power storage device i of the N power storage devices; the second static terminal 101_*i*3 of single-pole double-throw switch i 101_*i* is connected to the negative electrode of power storage device i; wherein i is an integer greater than or equal to 1 and less than or equal to N;

N capacitors 102, capacitor i 102_*i* of the N capacitors 102 comprises a first terminal 102_*i*1 and a second terminal 102_*i*2; the first terminal 102_*i*1 of capacitor i 102_*i* is connected to the selecting terminal 101_*i*1 of single-pole double-throw switch i 101_*i*; the second terminal 102_*i*2 of capacitor i 102_*i* is connected to a common neutral line 103;

a switch controller 104 connected to single-pole double-throw switch i 101_*i* through a control line 105; the switch controller 104 is configured to control the selecting terminal 101_*i*1 of single-pole double-throw switch i 101_*i* to be connected to the first static terminal 101_*i*2 or the second static terminal 101_*i*3 of single-pole double-throw switch i 101_*i*.

In the detailed implementation, please refer to FIGS. 3A and 3B, single-pole double-throw switch i 101_*i* comprises:

a first metal oxide semiconductor field effect transistor (that is first MOSFET) 101_*ia*;

a second metal oxide semiconductor field effect transistor (that is second MOSFET) 101_*ib* in series with the first metal oxide semiconductor field effect transistor 101_*ia*.

Further, the selecting terminal 101_*i*1 of single-pole double-throw switch i 101_*i* is a connection point between the first metal oxide semiconductor field effect transistor 101_*ia* and the second metal oxide semiconductor field effect transistor 101_*ib*.

Specifically, according to the different polarity of its channel, the metal oxide semiconductor field effect transistor (MOSFET, Metal-Oxide-Semiconductor Field-Effect Transistor) can be divided into the N-channel type with electronic accounted for most and the P-channel type with holes accounted for most, which are commonly known as N-type metal oxide semiconductor field effect transistor (NMOSFET) and P-type metal oxide semiconductor field effect transistor (PMOSFET). Thus, the internal structure of single-pole double-throw switch i 101_i consists of the following two situations:

1) The first MOSFET 101_ia and the second MOSFET 101_ib are both N-channel MOSFETs or P-channel MOSFETs:

Specifically, referring to FIG. 3A, which is the schematic view showing the internal structure of single-pole double-throw switch i 101_i when the first MOSFET and the second MOSFET are both N-channel MOSFETs. Single-pole double-throw switch i 101_i consists of two P-channels or N-channel MOSFETs in series. Wherein, the source of the first MOSFET 101_ia is connected to the drain of the second MOSFET 101_ib, and the connection point is the selecting terminal 101_i1 of single-pole double-throw switch i 101_i; the drain of the first MOSFET 101_ia is the first static terminal 101_i2 of single-pole double-throw switch i 101_i; the source of the second MOSFET 101_ib is the second static terminal 101_i3 of single-pole double-throw switch i 101_i. Besides, the situation is similar when the first MOSFET and the second MOSFET are both P-channel MOSFETs, and are not described here.

2) The first MOSFET 101_ia is the N-channel MOSFET and the second MOSFET 101_ib is the P-channel MOSFET, or the first MOSFET 101_ia is the P-channel MOSFET and the second MOSFET 101_ib is the N-channel MOSFET:

Specifically, referring to FIG. 3B, which is the schematic view showing the internal structure of single-pole double-throw switch i 101_i when the first MOSFET 101_ia is the N-channel MOSFET and the second MOSFET 101_ib is the P-channel MOSFET. Single-pole double-throw switch i 101_i consists of one P-channel MOSFET and one N-channel MOSFET in series. Wherein, the source of the first MOSFET 101_ia is connected to the source of the second MOSFET 101_ib, and the connection point is the selecting terminal 101_i1 of single-pole double-throw switch i 101_i; the drain of the first MOSFET 101_ia is the first static terminal 101_i2 of single-pole double-throw switch i 101_i; the drain of the second MOSFET 101_ib is the second static terminal 101_i3 of single-pole double-throw switch i 101_i; the grid of the first MOSFET 101_ia is connected to the grid of the second MOSFET 101_ib. Besides, the situation is similar when the first MOSFET is the P-channel MOSFET and the second MOSFET is the N-channel MOSFET, and are not described here.

In conjunction with FIGS. 3A and 3B, in both cases described above, a grid of the first metal oxide semiconductor field effect transistor 101_ia and a grid of the second metal oxide semiconductor field effect transistor 101_ib are respectively connected to the switch controller 104 through the control line 105.

Further, the switch controller 104 sends a control signal to single-pole double-throw switch i 101_i through the control line 105 to control the connection between the selecting terminal 101_i1 of single-pole double-throw switch i 101_i and the first static terminal 101_i2 or the second static terminal 101_i3 of single-pole double-throw switch i 101_i. In the specific implementation process, according to the different internal structure of single-pole double-throw switch i 101_i, the control signal is a bipolar square wave signal or a pair of complementary unipolar rectangular wave signals. The following will be described in detail with reference to FIGS. 3A and 3B:

1) First, referring to FIG. 3A, when the first MOSFET 101_ia and the second MOSFET 101_ib are both N-channel MOSFETs, the switch controller 104 generates a pair of complementary unipolar rectangular wave signals (104a, 104b); at this time, the control line 105 comprises two control sub-lines (105a, 105b). Wherein, the switch controller 104 is connected to the grid of the first MOSFET 101_ia through the control sub-line 105a to send the rectangular wave signal 104a to the first MOSFET 101_ia; the switch controller 104 is connected to the grid of the second MOSFET 101_ib through the control sub-line 105b to send the rectangular wave signal 104b to the second MOSFET 101_ib. Besides, the situation is similar when the first MOSFET and the second MOSFET are both P-channel MOSFETs, and are not described here.

2) Then, referring to FIG. 3B, when the first MOSFET 101_ia is the N-channel MOSFET and the second MOSFET 101_ib is the P-channel MOSFET, the switch controller 104 generates a bipolar square wave signal 104c; further, the switch controller 104 is connected to the grid of the first MOSFET 101_ia and the grid of the second MOSFET 101_ib through the control sub-line 105 to send the square wave signal 104c to the first MOSFET 101_ia and the second MOSFET 101_ib. Besides, the situation is similar when the first MOSFET is the P-channel MOSFET and the second MOSFET is the N-channel MOSFET, and are not described here.

In the present embodiment, the internal structure of the N single-pole double-throw switches 101 is not limited to the two specific embodiments shown in FIGS. 3A and 3B. Any other embodiment of the single-pole double-throw switch may be applied to the voltage balancing circuit 100 of the present application. It is to be noted that the clock phases for respectively controlling the N single-pole double-throw switches 101 (101_1, . . . , 101.N) becoming high (that is the selecting terminal is connected to the first static terminal) or becoming low (that is the selecting terminal is connected to the second static terminal) must be separated in time, and a reasonable safety margin must be set between the high switch clock phase and the low switch clock phase to prevent the circuit from being short-circuited.

According to the voltage balancing circuit of the present embodiment, the realization principle is described in detail below:

First, referring to FIG. 4A, when the switch members (101_1, . . . , 101_N) of the N single-pole double-throw switches 101 are all controlled to be high by the switch controller 104 (that is any switch member, such as the selecting terminal 101_i1 of single-pole double-throw switch i 101_i is connected to the first static terminal 101_i2, i ranging between 1 and N), the N capacitors 102 corresponding to the N single-pole double-throw switches 101 are connected to the anode of the corresponding power storage devices through the switch. Specifically, the capacitor 102_1 is connected to the anode of the power storage devices B1, the capacitor 102_2 is connected to the anode of the power storage devices B2, . . . , the capacitor 102_N is connected to the anode of the power storage devices BN; and then any two capacitors of the N capacitors 102 are charged or discharged to the power storage device between the first static terminals of the two switches to which the first terminals of the two capacitors are connected. Specifically, the capacitors 102_1 and 102_2 are charged or discharged to the power storage device B2; the capacitors 102_1 and 102_3 are charged or discharged to the power storage device group B2-B3; the capacitors 102_1 and 102_N are charged or discharged to the power storage device group B2-B3- . . . -BN; the capacitors 102_2 and 102_3 are charged or discharged to the power storage device B3; the capacitors 102_2 and 102_N are charged or discharged to the power storage device group B3- . . . -BN; the capacitor 102_3 and 102_N are charged or discharged to the power storage device group B4- . . . -BN.

Then, referring to FIG. 4B, when the switch members (101_1, . . . , 101_N) of the N single-pole double-throw switches 101 are all controlled to be low by the switch controller 104 (that is any switch member, such as the selecting terminal 101_i1 of single-pole double-throw switch i 101_i is connected to the second static terminal 101_i3, i ranging between 1 and N), the N capacitors 102 corresponding to the N single-pole double-throw switches 101 are connected to the cathode of the corresponding power storage devices through the switch. Specifically, the capacitor 102_1 is connected to the cathode of the power storage devices B1, the capacitor 102_2 is connected to the cathode of the power storage devices B2, . . . , the capacitor 102_N is connected to the cathode of the power storage devices BN; and then any two capacitors of the N capacitors 102 are charged or discharged to the power storage device between the second static terminals of the two switches to which the first terminals of the two capacitors are connected. Specifically, the capacitors 102_1 and 102_2 are charged or discharged to the power storage device B1; the capacitors 102_1 and 102_3 are charged or discharged to the power storage device group B1-B2; the capacitors 102_1 and 102_N are charged or discharged to the power storage device group B1-B2- . . . -BN−1; the capacitors 102_3 and 102_N are charged or discharged to the power storage device group B3-B4- . . . -BN−1.

FIG. 4A shows that the switch members of the N single-pole double-throw switches 101 are all controlled to be high, and FIG. 4B shows that the switch members of the N single-pole double-throw switches 101 are all controlled to be low, and these are the two working states of the voltage balancing circuit of the present application. In the specific implementation process, the switch controller 104 sends a control signal to the N single-pole double-throw switches 101, and the frequency at which it controls all the switch members (101_1, . . . , 101_N) of the N single-pole double-throw switches 101 to be high or low is a fixed frequency or a variable frequency, that is the control signal controls any switch (such as single-pole double-throw switch i 101_i) of the N single-pole double-throw switches 101 to be switched on/off at a fixed frequency or a variable frequency, in order to achieve an alternating switching of the two working states of the voltage balancing circuit.

In the process of alternately switching between the two working states, a power storage device having a high voltage is discharged to a power storage device having a low voltage. For example, when the voltage of the power storage device B3 is higher than the voltage of the power storage device B1, in the working state shown in FIG. 4A, the electric charge will flow from the power storage device group B2-B3 to the capacitors 102_1 and 102_3; further, the balancing circuit is switched to the working state as shown in FIG. 4B, equal amounts of charge are released from the capacitors 102_1 and 102_3 to the power storage device group B1-B2. During the entire process of charge transfer, the amount of charge flowing into and out of the power storage device B2 is the same, that is, the charge is actually transferred from the power storage device B3 to the power storage device B1; Likewise, when the voltage of the power storage device B1 is higher than the voltage of the power storage device B3, and when the two working states shown in FIGS. 4A and 4B are alternately performed, the charge is transferred from the power storage device B1 to the power storage device B3 through the capacitors 102_1 and 102_3. This actually means that the two capacitors 102_1 and 102_3 provide a path between the power storage device B1 and the power storage device B3 for the direct transfer of charge. Similarly, the capacitors 102_1 and 102_2 provide a direct charge transfer path between the power storage devices B1 and B2; the capacitors 102_2 and 102_3 provide a direct charge transfer path between the power storage devices B2 and B3; the capacitors 102_1 and 102_N provide a direct charge transfer path between the power storage devices B1 and BN; the capacitors 102_2 and 102_N provide a direct charge transfer path between the power storage devices B2 and BN; the capacitors 102_3 and 102_N provide a direct charge transfer path between the power storage devices B3 and BN; . . . ; and so on, in the voltage balancing circuit 100 of the present application, there is a direct charge transfer path provided by the two capacitors 102_j and 102_k between any two power storage devices Bj and Bk; where j and k are integers greater than or equal to 1 and less than or equal to N, and j is not equal to k.

According to the above description, it can be found that the basic voltage balancing principle of the voltage balancing circuit 100 of the present application is: when the voltage balancing is performed for the N power storage devices in series connection, the charge is transferred from the power storage device unit having the higher voltage to the power storage device unit having the lower voltage. That is, the power storage device unit having the lower initial voltage in the N power storage devices is charged, the charge flows into the power storage unit having a lower initial voltage and its voltage gradually rises during the charge transfer process; in contrast, the power storage device unit having a higher initial voltage in the N power storage devices is discharged, the charge flows out of the power storage unit having a higher initial voltage and its voltage gradually reduces during the charge transfer process. Further, with the alternating operation of the two working states as shown in FIGS. 4A and 4B, the voltages of the plurality of power storage devices are changed toward a common average voltage.

In the embodiment of the present application, the switch controller 104 controls the N single-pole double-throw switches to be switched off based on the control signal, so that the N capacitors 102 are switched on/off between charging and discharging. During the switching process, the capacitors of the N capacitors 102 are first charged by a power storage device having a higher voltage, and then discharged to a power storage device having a lower voltage. Through this charge and discharge process, the charging current flows out of the power storage device having a higher voltage in the N power storage devices and flows into the power storage device having a lower voltage; further, if the switching process is performed at a high switching frequency, a large amount of charge is reallocated, and the voltage of the N power storage devices will be balanced. In other embodiments, the balancing switch (i.e., the N single-pole double-throw switches 101) and the switch controller 104 can implement various working states of the voltage balancing circuit of the present application in various other ways, for example, a driving circuit is provided between the N single-pole double-throw switches 101 and the switch controller 104. The driving circuit is used to realize various working states of voltage balancing circuit through optical or magnetic coupling, and there is no specific limitation here.

In the specific implementation process, in the N capacitors 102, the larger the capacitance value that a capacitor has, then more charge is transferred, and the faster the two working states shown in FIGS. 4A and 4B are alternately switched, the more charge is transferred per unit time; that is, the voltage balancing speed of the voltage balancing circuit of the present application depends on the charge transfer rate, i.e., the amount of charge transferred per unit time. Specifically, more amount of charge are transferred per unit time, then faster the voltage equalization rate becomes. It is meant that the balancing speed of the voltage balancing circuit 100 of the present application is proportional to the switching frequency of the N single-pole double-throw switches 101 and the capacitance values of the capacitance members of the N capacitors 102.

In the specific implementation process, the N power storage devices comprise at least one type of rechargeable batteries and super capacitors; and the rechargeable battery is a single battery cell or a battery pack in which a plurality of single battery cells are connected in series. And the super capacitor is a single capacitor cell or a super capacitor pack in which a plurality of single super capacitor cells are connected in series. Specifically, the number of the plurality of power storage devices in series connection is not limited by the voltage balancing circuit 100 of the power storage device. As shown in FIG. 5, taking the power storage device as a battery, the voltage balancing circuit 100 can also be applied to the voltage balance of a plurality of battery packs connected in series (that is N battery packs BP, N is an integer greater than or equal to 2). In FIG. 5, N battery packs BP are represented as BP1 to BPN. For the case of multiple battery packs, in the specific implementation process, the setting and switching control methods of the N single-pole double-throw switches 101 are the same as those of the previously mentioned voltage balancing for a plurality of power storage devices connected in series; that is, in the voltage balancing circuit 100 of the present application, through the capacitors 102_j and 102_k connected in series, a direct charge transfer path is provided between any two battery packs BPj and BPk, where j and k are greater than or equal to 1 and less than or equal to N, and j is not equal to k. In addition, the voltage balancing circuit of the present application is also applicable when the N power storage devices are super capacitors or the hybrid power storage device group consisting of batteries and super capacitors.

Embodiment Two

Referring to FIG. 6, on the basis of embodiment one, in order to reduce the switching noise and electromagnetic interference (EMI, Electro Magnetic Interference) when the N single-pole double-throw switches are switched on/off, the voltage balancing circuit 100 further comprises N inductors 106; where, the second terminal 102_i2 of capacitor i 102_i is connected to the common neutral line 103 through inductor i 106_i of the N inductors 106.

As shown in FIG. 6, an integrated body consisting of a capacitor 102_i and an inductor 106_i connected in series with each other is disposed on connecting line between the selecting terminal 101_i1 of any switch 101_i of the N single-pole double-throw switches 101 and the common neutral line 103, so that during working process the balancing circuit exhibits properties similar to resonance. Through this circuit design, the current flowing into or out of any of the N capacitors 102 will be changed from zero on the moment when the switch state of the N single-pole double-throw switches 101 is changed, thus helping to reduce switching noise and EMI and providing working quality of the circuit. In addition, in the specific implementation process, the selected N inductors 106 may be conventional small volume inductors that do not result to the volume of the balancing circuit to be large.

In addition to the above-mentioned one or more specific embodiments, the target object of the voltage balancing circuit of the present application is not limited, that is, the targeted plurality of series-connected power storage devices may be constituted by at least one of a single battery cell, a super capacitor, and a battery pack; further, in the voltage balancing process, the energy stored in the power storage device with high voltage is directly transferred to the power storage device with low voltage; the voltage balancing speed of the voltage balancing circuit depends on the switching frequency of the plurality of single-pole double-throw switch 101 in the circuit and the capacitance of the respective capacitor members in the plurality of capacitors 102, and is not affected by the type and number of series-connected power storage devices, and the balance speed is flexible and adjustable; in addition, in this invention, it is not necessary to use magnetic components with large volumes, complex sensors or complex closed-loop controllers, thus ensuring the simplicity, small size and low cost of the balancing circuit.

While the preferred embodiments of the present application have been described, it will be apparent to those skilled in the art that other changes and modifications may be made to these embodiments once the basic inventive concepts are known. Accordingly, the appended claims are intended to be construed as including preferred embodiments and all changes and modifications that fall within the scope of the invention.

It will be apparent to those skilled in the art that various changes and modifications can be made therein without departing from the spirit and scope of the application so that if such modifications and variations of the invention are within the scope of the appended claims and the equivalents thereof. The present application is also intended to embrace such variations and variations.

The invention claimed is:

1. A voltage balancing circuit applied to a power supply system, wherein, the power supply system comprises N power storage devices; any power storage device of the N power storage devices comprises a positive electrode and a negative electrode; the positive electrode of power storage device n of N power storage devices is connected to the negative electrode of power storage device n+1 of N power storage devices; wherein N is an integer greater than or equal to 2, and n is an integer greater than or equal to 1 and less than N; the voltage balancing circuit (100) comprises: N single-pole double-throw switches (101), single-pole double-throw switch i (101_i) of the N single-pole double-throw switches (101) comprises: a selecting terminal (101_i1), a first static terminal (101_i2) and a second static terminal (101_i3); the first static terminal (101_i2) of single-pole double-throw switch i (101_i) is connected to the positive electrode of power storage device i of the N power storage devices; the second static terminal (101_i3) of single-pole double-throw switch i (101_i) is connected to the negative electrode of power storage device i; wherein i is an integer greater than or equal to 1 and less than or equal to N; N capacitors (102), capacitor i (102_i) of the N capacitors (102) comprises a first terminal (102_i1) and a second terminal (102_i2); the first terminal (102_i1) of capacitor i (102_i) is connected to the selecting terminal (101_i1) of single-pole double-throw switch i (101_i); the second terminal (102_i2) of capacitor i (102_i) is connected to a common neutral line (103); a switch controller (104) is connected to single-pole double-throw switch i (101_i) through a control line (105); the switch controller (104) is configured to control the selecting terminal (101_i1) of single-pole double-throw switch i (101_i) to connect to the first static terminal (101_i2) or the second static terminal (101_i3) of single-pole double-throw switch i (101_i);

wherein, single-pole double-throw switch i (101_i) comprises: a first metal oxide semiconductor field effect transistor (101_ia); a second metal oxide semiconductor field effect transistor (101_ib) in series connection with the first metal oxide semiconductor field effect transistor (101_ia);

wherein, the selecting terminal (101_i1) of single-pole double-throw switch i (101_i) is a connection point between the first metal oxide semiconductor field effect transistor (101_ia) and the second metal oxide semiconductor field effect transistor (101_ib); a grid of the first metal oxide semiconductor field effect transistor (101_ia) and a grid of the second metal oxide semiconductor field effect transistor (101_ib) are respectively connected to the switch controller (104) through the control line (105);

wherein, the voltage balancing circuit (100) further comprises N inductors (106); wherein, the second terminal (102_i2) of capacitor i (102_i) is connected to the common neutral line (103) through inductor i (106_i) of the N inductors (106);

the switch controller (104) sends a control signal to single-pole double-throw switch i (101_i) through the control line (105) to control the connection between the selecting terminal (101_i1) of single-pole double-throw switch i (101_i) and the first static terminal (101_i2) or the second static terminal (101_i3) of single-pole double-throw switch i (101_i) and the selecting terminal (101_i+1) is connected to the first static terminal (101_i2) or the second static terminal (101_i3) of single-pole double-throw switch i (101_i+1); when the selecting terminal (101_i1) is connected to the first static terminal (101_i2) or the second static terminal (101_i3), there are two capacitors and two inductors in charging circuit or discharging circuit.

2. The voltage balancing circuit according to claim 1, wherein, the N power storage devices comprise at least one type of rechargeable batteries and super capacitors.

3. The voltage balancing circuit according to claim 2, wherein, the rechargeable battery is a single battery cell or a battery pack in which a plurality of single battery cells are connected in series, and the super capacitor is a single capacitor cell or a super capacitor pack in which a plurality of single super capacitor cells are connected in series.

4. The voltage balancing circuit according to claim 1, wherein, the control signal is a bipolar square wave signal or a pair of complementary unipolar rectangular wave signals.

5. The voltage balancing circuit according to claim 4, wherein, the control signal controls single-pole double-throw switch i (101_i) is to be switched on/off at a fixed frequency or a variable frequency.

* * * * *